(12) United States Patent
Chong et al.

(10) Patent No.: US 8,315,123 B2
(45) Date of Patent: Nov. 20, 2012

(54) WORDLINE VOLTAGE CONTROL WITHIN A MEMORY

(75) Inventors: Yew Keong Chong, New Braunfels, TX (US); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 27 days.

(21) Appl. No.: 12/926,964

(22) Filed: Dec. 20, 2010

(65) Prior Publication Data

US 2012/0155194 A1  Jun. 21, 2012

(51) Int. Cl.
*G11C 8/00* (2006.01)
(52) U.S. Cl. ............... 365/230.06; 365/189.11; 365/194
(58) Field of Classification Search ............ 365/230.06, 365/189.11, 194, 233.1, 205, 154
See application file for complete search history.

(56) References Cited

U.S. PATENT DOCUMENTS 7,269,091 B2 *  9/2007  Ueda ..................... 365/230.06

OTHER PUBLICATIONS

Saito et al., "Multi-step Word-line Control Technology in Hierarchical Cell Architecture for Scaled-down High-density SRAMs", *IEEE 2010 Symposium on VLSI Circuits*, (No Date), pp. 101-102.

* cited by examiner

*Primary Examiner* — David Lam
(74) *Attorney, Agent, or Firm* — Nixon & Vanderhye P.C.

(57) ABSTRACT

A memory circuit 2 includes bit cells 4 selected for reading with a word line voltage upon a word line 20. Word line voltage control circuitry 26 generates a two-step word line voltage signal. The word line voltage first increases to an intermediate level at which word line transistors 12 weakly couple the bit cell 4 to the bit lines 8. This intermediate level is maintained for a first delay period. After the first delay period, the word line voltage is increased to a full rail value and this full rail value maintained for a second delay period. The word line voltage is then returned to a low level at the end of the read operation. This two-step word line voltage signal provides a better access disturb margin for the bit cell 4.

25 Claims, 5 Drawing Sheets

WORDLINE VOLTAGE CONTROL WITHIN A MEMORY

BACKGROUND OF THE INVENTION

1. Field of the Invention

Figure 1:
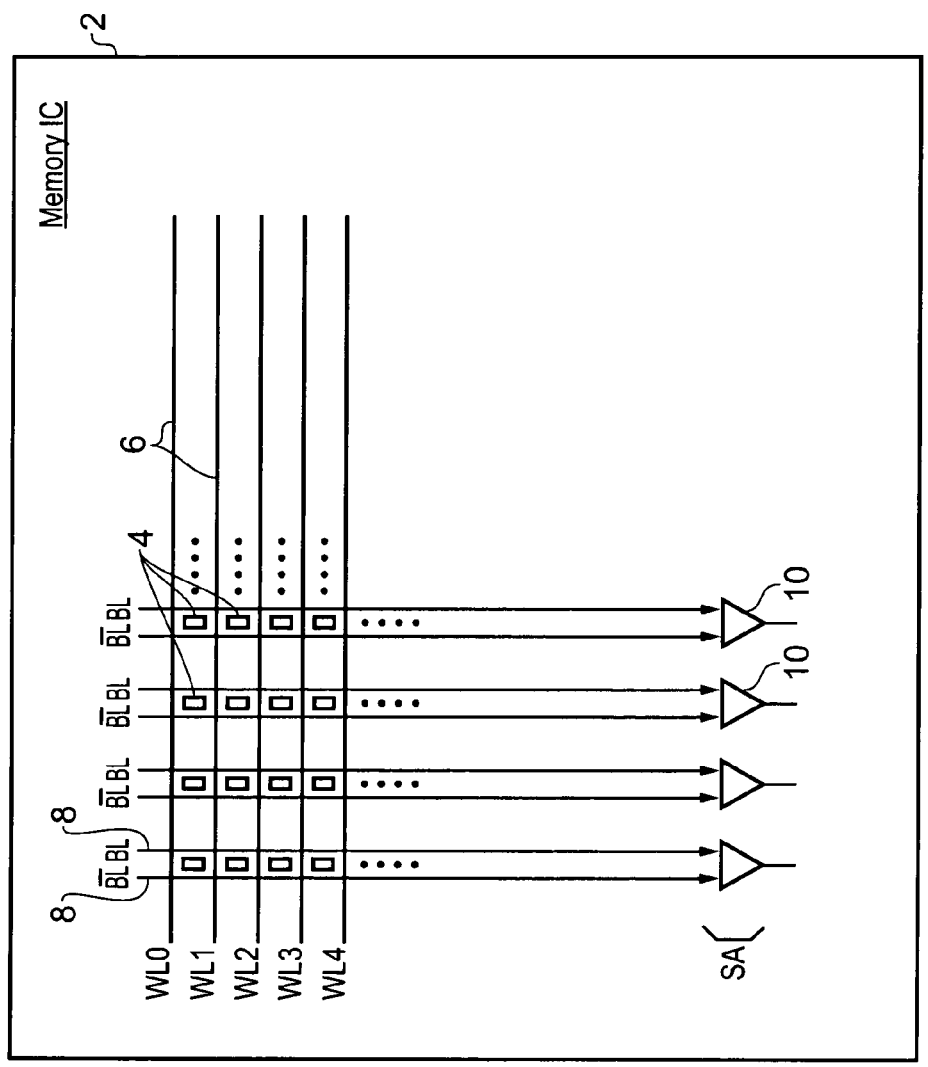

This invention relates to the field of memory circuits. More particularly, this invention relates to the control of the word line voltage used to trigger the read of a bit cell within a memory circuit.

2. Description of the Prior Art

It is known to provide memory circuits comprising an array of bit cells with each bit cell having a node storing a data value. This node is coupled to a bit line for reading the stored data value via a word line transistor. The word line transistor has a conductance which is dependent upon a word line voltage of a word line signal upon a word line coupled to the bit cell being read.

As the size of the circuit elements within a memory circuit has become smaller, due to the user of smaller integrated circuit geometries, and the operating voltages of the memories have reduced in an effort to reduce power consumption, an increasing problem is the access disturb margin associated with a memory. When a read access is made to a bit cell the data value being stored may be incorrectly read due to effects such as charge sharing between the bit lines and the internal node resulting in stability issues within the bit cell.

SUMMARY OF THE INVENTION

Viewed from one aspect the present invention provides a memory circuit comprising:

an array of bit cells including a bit cell coupled to at least one bit line and a word line, said bit cell having a node storing a data value and a word line transistor configured to provide a current path between said node and a bit line of said at least one bit line with a conductance dependent upon a word line voltage of a word line signal upon said word line; and word line driver circuitry configured to control said word line voltage during an access to said bit cell:

(i) to change during a first change period from a first voltage level at which said word line transistor has a low conductance to an intermediate voltage level at which said word line transistor has an intermediate conductance;

(ii) substantially to maintain during a first delay period said intermediate voltage level;

(iii) to change during a second change period from said intermediate level to a second voltage level at which said word line transistor has a high conductance;

(iv) substantially to maintain during a second delay period said second voltage level; and (v) to change during a third change period from said second voltage level to said first voltage level; wherein said intermediate voltage level is between said first voltage level and said second voltage level.

The present technique provides a memory in which the word line voltage is controlled during either or both of a read access and a write access so that it first changes to a level at which the word line transistor has an intermediate conductance and is then held substantially at this level during a first delay period before being changed to a level at which the word line transistor has a high conductance. This stepping of the word line voltage reduces the access disturbance of the bit cell thereby increasing the reliability of the memory.

The variation in the word line voltage outlined above may be achieved in some embodiments arranged such that said word line driver circuit provides a current path between a supply voltage source and said word line that has:

(i) a first low conductance when said bit cell is not accessed;

(ii) an intermediate conductance during said first change period;

(iii) a second low conductance during said first delay period;

(iv) a high conductance during said second change period and said second delay period; and (v) a third low conductance during said third change period; and said intermediate conductance is between said first low conductance and said high conductance.

The various low conductance levels may have different absolute values but in only some embodiments these may a common low conductance. In other embodiments, for example, the second low conductance may have an absolute value higher than the first and third low conductance levels. The second low conductance could thus also be considered to be a second intermediate conductance level. The second low conductance is a term intended to signify a conductance less than the intermediate conductance that is used during the first change period.

The variation in the conductance of the current path between the supply voltage source and the word line may be achieved in a variety of different ways. In some embodiments this current path may be arranged to pass through a weak transistor and a strong transistor disposed in parallel.

With the above arrangement suitable changes in the conductance of the current path between the supply voltage source and the word line may be achieved when said word line driver circuitry controls said weak transistor and said strong transistor such that:

(i) when said bit cell is not being read said weak transistor is in a low conductance state and said strong transistor is in a low conductance state;

(ii) during said first change period said weak transistor is in a high conductance state and said strong transistor is in said low conductance state;

(iii) during said first delay period said weak transistor is in said low conductance state and said strong transistor is in said low conductance state;

(iv) during said second change period and said second delay period said strong transistor is in a high conductance state; and (v) during said third change period said weak transistor is in said low conductance state and said strong transistor is in said low conductance state.

The weak transistor may in some embodiments be conductive at the same time that the strong transistor is conductive, but in other embodiments it is convenient that the weak transistor should be switched off when the strong transistor is switched on.

In some embodiments the word line driver circuitry may be buffer circuitry for responding to a word line selecting signal to drive the word line to the word line voltage. In this context, the weak transistor and the strong transistor may serve to provide a power supply current to the buffer circuitry from the supply voltage source.

Some embodiments may also operate in a basic mode in which said word line voltage is controlled during an access to said bit cell:

(i) to change during a first normal mode change period from said first voltage level to said high voltage level;

(ii) substantially to maintain during a normal mode delay period said high voltage level; and (iii) to change during a second normal mode change period from said high voltage level to said first voltage level.

A sense amplifier for reading the bit lines may be activated by an activation signal generated with a delay which is varied dependence upon whether or not the word line circuitry is operating in the basic mode or the mode using a two-step word line voltage signal.

The characteristics of the two-step word line voltage signal may be varied and in particular the height of the first step and the duration of the first step may be selectable in dependence upon one or more configuration signals received by the memory.

Viewed from another aspect the present invention provides a memory circuit comprising:

an array of bit cell means for storing data values, said array including bit cell means coupled to at least one bit line and a word line, said bit cell means having a node storing a data value and word line transistor means for providing a current path between said node and a bit line of said at least one bit line with a conductance dependent upon a word line voltage of a word line signal upon said word line; and word line driver means for controlling said word line voltage during an access to said bit cell means:

(i) to change during a first change period from a first voltage level at which said word line transistor means has a low conductance to an intermediate voltage level at which said word line transistor means has an intermediate conductance;

(ii) substantially to maintain during a first delay period said intermediate voltage level;

(iii) to change during a second change period from said intermediate level to a second voltage level at which said word line transistor means has a high conductance;

(iv) substantially to maintain during a second delay period said second voltage level; and (v) to change during a third change period from said second voltage level to said first voltage level; wherein said intermediate voltage level is between said first voltage level and said to second voltage level.

Viewed from a further aspect the present invention provides a method of operating a memory circuit having:

an array of bit cells including a bit cell coupled to at least one bit line and a word line, said bit cell having a node storing a data value and a word line transistor configured to provide a current path between said node and said bit line with a conductance dependent upon a word line voltage of a word line signal upon said word line, said method comprising the steps of:

(i) changing during a first change period from a first voltage level at which said word line transistor has a low conductance to an intermediate voltage level at which said word line transistor has an intermediate conductance;

(ii) substantially maintaining during a first delay period said intermediate voltage level;

(iii) changing during a second change period from said intermediate level to a second voltage level at which said word line transistor has a high conductance;

(iv) substantially maintaining during a second delay period said second voltage level; and (v) changing during a third change period from said second voltage level to said first voltage level; wherein said intermediate voltage level is between said first voltage level and said second voltage level.

The above, and other objects, features and advantages of this invention will be apparent from the following detailed description of illustrative embodiments which is to be read in connection with the accompanying drawings.

BRIEF DESCRIPTION OF TILE DRAWINGS

Figure 2:
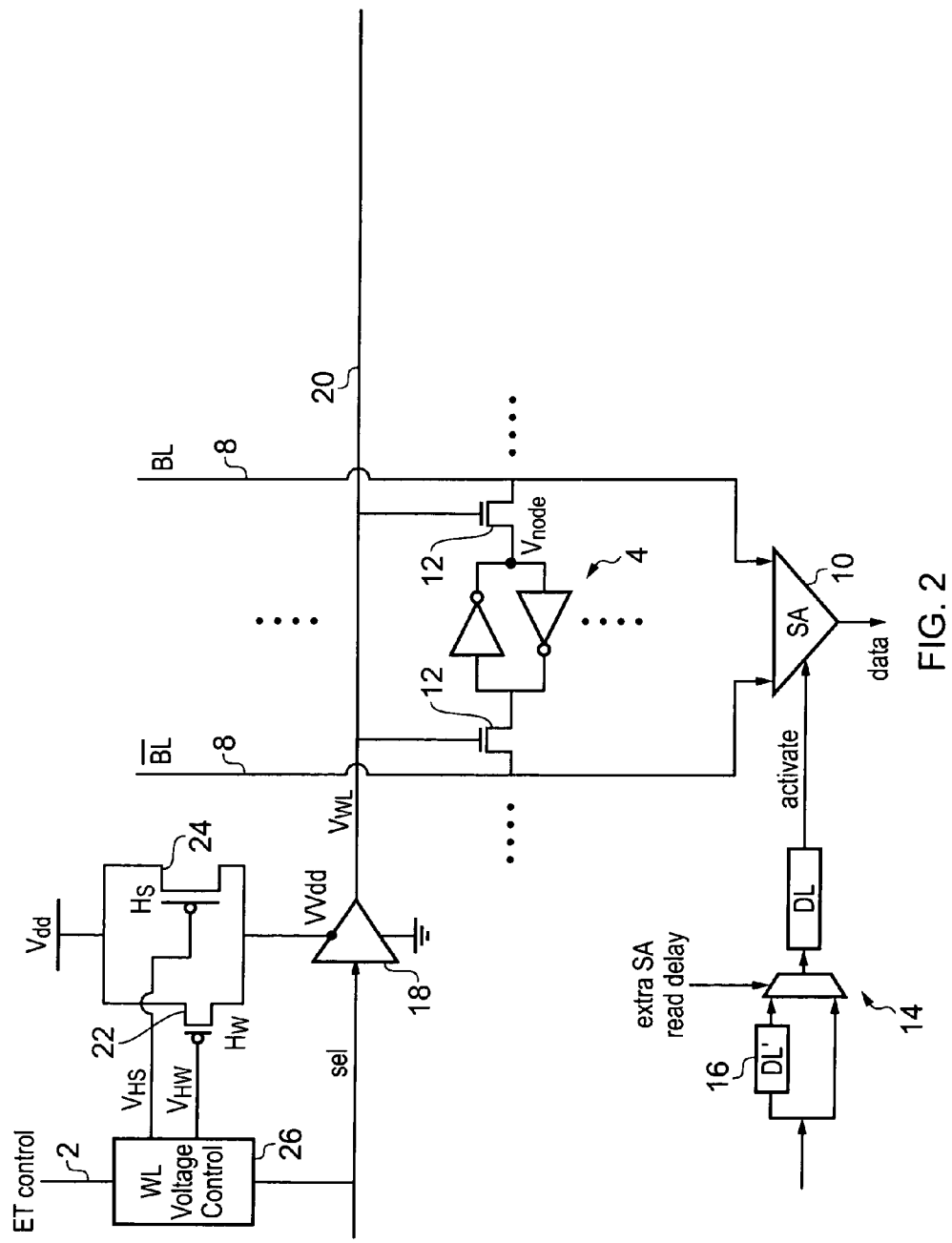
Figure 3:
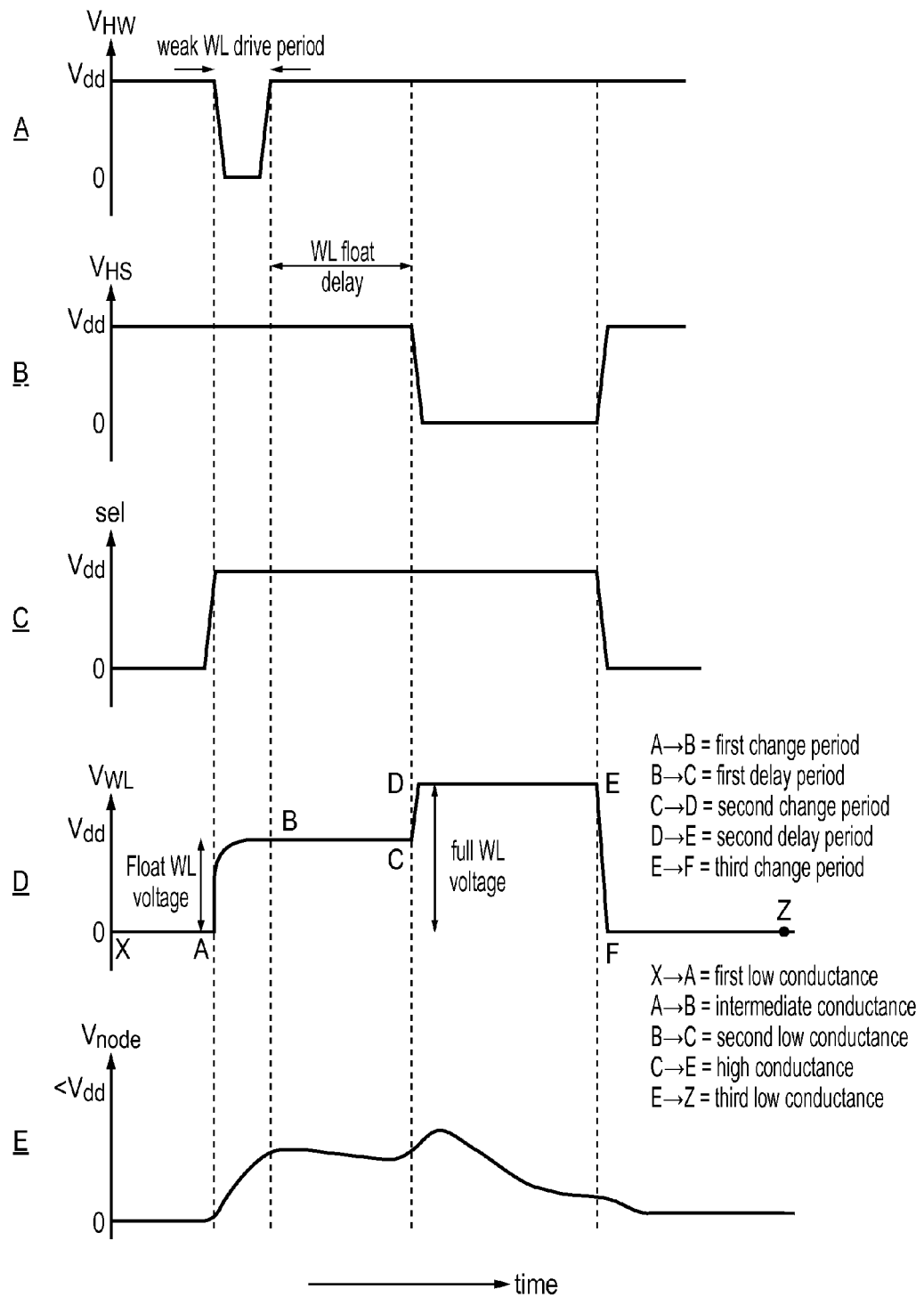
Figure 4:
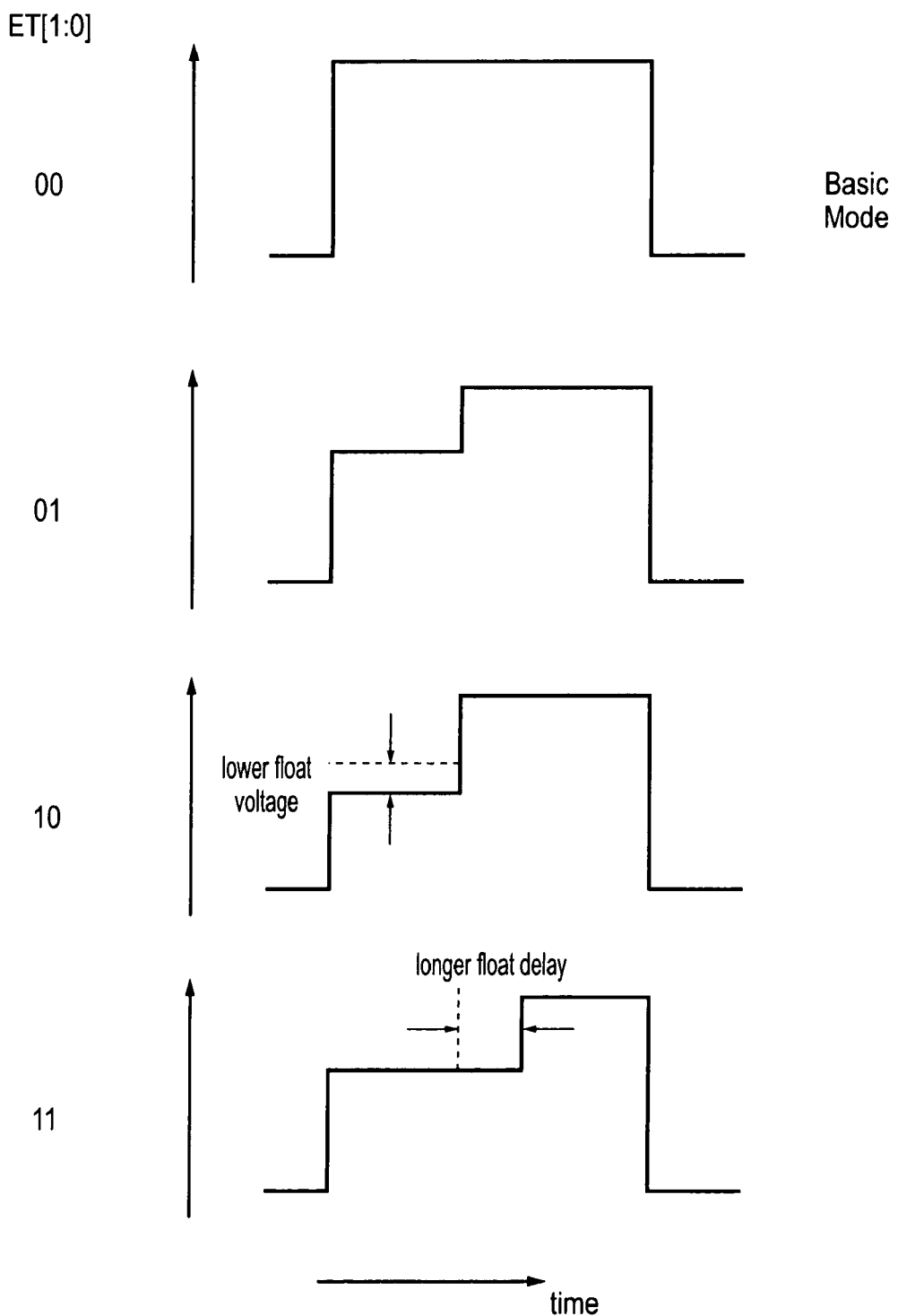
Figure 5:
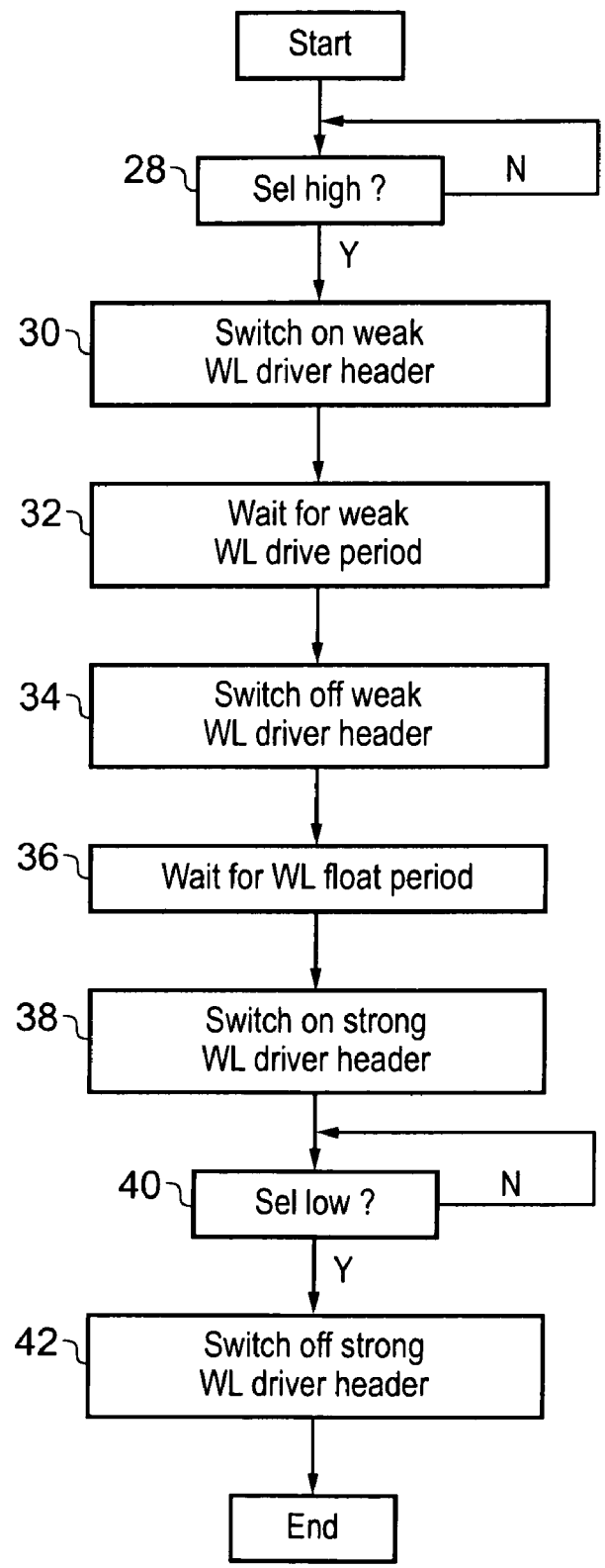

FIG. 1 schematically illustrates a memory integrated circuit including an array of bit cells having bit lines and word lines running therethrough;

FIG. 2 schematically illustrates a bit cell and associated word line driver circuitry and sense amplifier;

FIG. 3 is a signal diagram illustrating the variation with time during a read and write access of a plurality of signals within the example embodiment of FIG. 2;

FIG. 4 schematically illustrates how the characteristics of the word line voltage during a read and write operation may be varied in accordance with configuration parameters; and FIG. 5 is a flow diagram schematically illustrating the operation of the circuit of FIG. 2.

DESCRIPTION OF THE EMBODIMENTS

FIG. 1 schematically illustrates a memory circuit 2 including an array of bit cells 4. Word lines 6 run across rows of the bit cells 4 and serve to carry a word line voltage ($V_{WL}$) to word line transistors associated with each bit cell 4. The word line transistors 12 provide a current path between a node within the bit cell 4 bearing a data value and a corresponding bit line 8 coupled to a column of bit cells 4. Sense amplifiers 10 link to the bit lines 8 serve to detect a voltage difference between the bit lines 8 (BL, $\overline{BL}$) coupled to a bit cell 4 being read and to generate an output data signal corresponding to the data value being read.

It will be appreciated that the memory circuit 2 will typically contain many further circuit elements. These have been omitted from FIG. 1 for the sake of clarity. It will be further appreciated that the memory circuit 2 could be provided within the integrated chip together with other circuit elements, such as within a system-on-chip integrated circuit also bearing portions corresponding to a processor core, input/output circuitry, cache memories etc.

FIG. 2 schematically illustrates a bit cell 4 with a node carrying a signal $V_{node}$ corresponding to a data value being stored within the bit cell 4. Word line transistors 12 couple the bit cell 4 to respective bit lines 8. When the word line transistors 12 are switched on (i.e. moved from a low conductance state to a high conductance state or an intermediate conductance state), then the voltages on the bit lines 8 will vary in dependence upon the data value being stored within the bit cell 4. The different in voltage between the two bit lines 8 coupled to the bit cell 4 is detected by the sense amplifier 10.

The sense amplifier 10 is activated by an activation signal received from delay circuitry 14. The delay circuitry 14 serves to switch on the sense amplifier 10 after a given delay period following the start of a read access. This saves power as the bit lines 8 will not have reached a voltage level at which a voltage difference can be sensed therebetween until sufficient time has elapsed from the start of the read access. If the read access is slowed, for example by the use of the two-step word line voltage as described later, then it is appropriate to delay the activation of the sense amplifier 10 as the read access as a whole will be slowed. In this case, an additional delay line 16 is switched into the delay circuit 14 signal path in order to delay the arrival of the activation signal at the sense amplifier 10 when a two-step word line voltage signal is being used. When a normal word line voltage signal is being used, then the extra delay line 16 will not be selected and the activation signal will arrive sooner within the read access.

A buffer 18 serves to drive a word line 20 coupled to the gates of the word line transistors 12. The buffer 18 is coupled to a supply voltage source $V_{dd}$ via a weak transistor 22 and a strong transistor 24 connected in parallel. The weak transistor 22 is formed as a physically small header transistor which will have a relatively low conductance when it is switched on. The strong transistor 24 is formed as a physically larger header transistor which will have a higher conductance when it is switched on.

When only the weak transistor 22 is switched on and is supplying power to the buffer 18, the rate of change in voltage which the buffer 18 can drive upon the word line 20 will be reduced. In contrast, when the strong transistor 24 is switched on the buffer 18 drives the word line 20 rapidly to provide a near full rail word line voltage (e.g. approaching $V_{dd}$). A word line selecting signal sel is received by the buffer 18 and serves to generate the signal upon the word line 20 when a given row of bit cells 4 is selected for reading. The select signal sel is also supplied to word line voltage control circuitry 26.

The word line voltage control circuitry 26 serves to generate signals which switch on and switch off the weak transistor 22 and the strong transistor 24 in order to generate a two-step word line voltage upon a read and write access. In particular, when a rising edge in the select signal is detected, the word line voltage control signal 26 serves to switch on the weak transistor 22 for a first change period during which the buffer 18 drives the word line voltage up to an intermediate level. The word line voltage controller 26 then switches off the weak transistor 22 (places it into a low conductance state). This substantially isolates the buffer 18 from the supply voltage source $V_{dd}$ with the result that the word line voltage on the word line 20 floats and thereby remains substantially constant. It will be appreciated that small variations may occur in the word line voltage during this period when it is not being actively driven by the buffer 18. However, during the undriven period the word line voltage can be considered to substantially maintain its intermediate voltage level and be floating in an electrical sense while the buffer 18 is effectively isolated from its power supply.

After a first delay period during which the intermediate voltage level is maintained on the word line 20, the word line voltage control circuitry 26 switches on the strong transistor 24. The strong transistor 24 provides a high conductance path between the supply voltage source $V_{dd}$ and the buffer 18. Thus, the buffer 18 is able rapidly to drive the word line 20 to a word line voltage higher than the intermediate voltage level. This high voltage level is maintained for a second delay period. The end of this second delay period is determined when the selection signal Sel is de-asserted, at which time the buffer 18 drives the word line 20 back to its original starting voltage and the word line voltage control circuitry 26 switches off the strong transistor 24. The weak transistor 22 may remain switched off during this second delay period or it may be switched on so as to assist the strong transistor 24 in driving the word line 20.

Above and in the following example of the description, the word line voltage has been indicated as being low when the bit cell 4 is not being read and being high when the bit cell 4 is being read. It will be appreciated by those in this technical field that it is possible that these signal levels could be reversed with an appropriate conversion of the various transistors and other circuit elements. Such modifications are encompassed within the present technique. The above is described in the context of a read access. The same control over the word line voltage could also (or alternatively) be used during a write access if desired. This helps address the problem that a read disturb can occur in the bit cells of the unselected columns within a selected row during a write operation.

FIG. 3 illustrates the variation of a plurality of signals within the circuit of FIG. 2 during a read and write access. Signal line A illustrates the variation in the signal supplied to the weak transistor 22 which serves to turn on the weak transistor 22 (i.e. place the weak transistor into a high conductance state) for a weak word line drive period. This weak word line drive period can be varied in dependence upon configuration signals ($ET_{control}$; extended time control) supplied to the word line voltage control circuitry 26. The duration of the weak word line drive period controls the magnitude of the intermediate voltage which is reached and which is thereafter maintained during the word line voltage float delay.

Signal B illustrates the signal turning on and off the strong transistor 24. The strong transistor 24 remains turned off until after the weak word line drive period and a word line float delay have expired. The strong transistor 24 is then turned on (moved from a low conductance state to a high conductance state). This has the result that the buffer 18 is able to rapidly drive the word line 20 to the full rail supply voltage level (or close to this level).

Signal C illustrates the relative timing of the select signal supplied to the buffer 18. The rising edge of the select signal is detected by the word line voltage control circuitry 26 and is used to initiate the start of the actions of the word line voltage control circuitry 26 during. In particular, the rising edge of the select signal sel initiates the weak transistor 22 being switched on for the weak word line drive period. The falling edge of the select signal results in the buffer 18 driving the word line voltage on the word line 20 low and also triggers the word line voltage controller 26 to switch off the strong transistor 24.

Signal D illustrates the variation in the word line voltage over time. When the weak transistor 22 is switched on, the word line voltage is driven to an intermediate level. The intermediate voltage level is substantially maintained during a float period. When the strong transistor 24 is turned on, the word line voltage is driven higher and rapidly reaches a full rail value. When the select signal sel is de-asserted, the word line voltage is driven low and the strong transistor 24 is switched off.

Various points along the variation of the word line voltage with time are marked on signal D. The time from A to B corresponds to a first change period in which the word line voltage is changed to a first voltage level at which the word line transistor 12 has a low conductance to an intermediate voltage level at which the word line transistor has an intermediate conductance. The period from B to C corresponds to a first delay period during which the word line voltage is substantially maintained at the intermediate voltage level. The period from C to D corresponds to a second change period during which the word line voltage is changed from the intermediate voltage level to a second voltage level at which the word line transistor 12 has a high conductance. The period from D to E corresponds to a second delay period during which the word line voltage is substantially maintained at the second voltage level. The period from E to F corresponds to a third change period during which the word line voltage is changed from the second voltage level to the first voltage level. Returning the word line voltage to the first voltage level returns the word line transistor(s) 12 to a low conductance state.

The switching on and switching off of the weak transistor 22 and the strong transistor 24 with the timings discussed above in conjunction with the buffer 18 serves to provide a current path between a supply voltage source $V_{dd}$ and the word line 20 that has a conductance which varies with time. In particular, during the period X to A when the bit cell is not being read, this current path has a first low conductance. During the period A to B, corresponding to the first change period, the current path has an intermediate conductance corresponding to the weak transistor 22 being switched on and the strong transistor 24 being switched off. During the period B to C, corresponding to the first delay period, the current path has a second low conductance (which may be the same as the first low conductance) corresponding to both the weak transistor 22 and the strong transistor 24 being switched off. During the period C to E, corresponding to the second change period and the second delay period, the current path has a high conductance corresponding to the strong transistor 24 being switched on. During the period E to Z, which extends through the third change period, the current path has a third low conductance which may be the same as the first low conductance and the second low conductance. The intermediate conductance is between the first low conductance and the high conductance in magnitude.

Signal E illustrates the variation in the voltage $V_{node}$ the node within the bit cell 4 carrying the data value as the read operation progresses. It will be seen that the voltage is at first perturbed from its steady state as the word line transistors 12 are switched and couple the data value to the bit lines 8. However, as the word line voltage has been reduced during the first portion of the two-step word line voltage signal, the word line transistors 12 are only partially switched on (at an intermediate level of conductance) and accordingly the disturbance to the data value stored at the node within the bit cell 4 is reduced. This reduction in disturbance of the data value is sufficient to provide a better access disturb margin for the bit cell 4. The reduced conductance through the word line transistors 12 does reduce the speed at which the bit lines 8 change the bit line voltages and accordingly the activation of the sense amplifier 10 may be delayed as previously described to correspond to the slowed read access. When the strong transistor 24 is switched on and the word line voltage is driven to the full rail value, the data value is again perturbed, but by a reduced amount before settling back down to its steady state. The overall effect of the two-step nature of the word line voltage is that it reduces the magnitude of the disturbance of the data values stored at the node within the bit cell 4 as illustrated in signal E.

FIG. 4 schematically illustrates the effect of extended time control signals $ET_{control}$) upon the word line voltage control circuitry 26. These are a two-bit control signal. When the control signal is 00, then the two-step word line voltage signal previously described is not used and instead a simple square wave word line voltage signal is used as illustrated. When the control signal is 01, then a base two-step word line voltage signal is generated and used as shown. The word line voltage control circuitry 26 responds to the control signal being 10 or 11 by either lowering the float voltage level of the word line voltage during the first delay period or extending the first delay period. Lowering the float voltage level may be achieved by switching on the weak transistor 22 for a shorter period of time, i.e. reducing the weak word line drive period. The first delay period at which the word line voltage is allowed to maintain the intermediate level may be extended by the use of appropriate delay lines within the word line voltage control circuitry 26 which control the switching on of the strong transistor 24.

FIG. 5 schematically illustrate a flow diagram corresponding to the operation of the circuit of FIG. 2. At step 28 processing waits until the selection signal received by the buffer 18 and the word line voltage control circuitry 26 goes high. At step 30 the weak transistor 22 is switched on. At step 32 the word line voltage control circuitry waits for the weak word line drive period to expire. When the weak word line drive period has expired, then step 34 switches off the weak transistor 22. Step 36 waits until the word line float period expires. When the word line float period has expired, then step 38 switches on the strong transistor 24. Step 40 waits until the selection signal goes low. Step 42 switches off the strong transistor 24.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:
1. A memory circuit comprising:
   an array of bit cells including a bit cell coupled to at least one bit line and a word line, said bit cell having a node storing a data value and a word line transistor configured to provide a current path between said node and a bit line of said at least one bit line with a conductance dependent upon a word line voltage of a word line signal upon said word line; and
   word line driver circuitry configured to control said word line voltage during a access to said bit cell:
   (i) to change during a first change period from a first voltage level at which said word line transistor has a low conductance to an intermediate voltage level at which said word line transistor has an intermediate conductance;
   (ii) substantially to maintain during a first delay period said intermediate voltage level;
   (iii) to change during a second change period from said intermediate level to a second voltage level at which said word line transistor has a high conductance;
   (iv) substantially to maintain during a second delay period said second voltage level; and
   (v) to change during a third change period from said second voltage level to said first voltage level; wherein
   said intermediate voltage level is between said first voltage level and said second voltage level.

2. A memory circuit as claimed in claim 1, wherein said word line driver circuit provides a current path between a supply voltage source and said word line that has:
   (i) a first low conductance when said bit cell is not accessed;
   (ii) an intermediate conductance during said first change period;
   (iii) a second low conductance during said first delay period;
   (iv) a high conductance during said second change period and said second delay period; and
   (v) a third low conductance during said third change period; and
   said intermediate conductance is between said first low conductance and said high conductance.

3. A memory circuit as claimed in claim 2, wherein said first low conductance and said second low conductance are a common low conductance.

4. A memory circuit as claimed in claim 3, wherein said third low conductance is said common low conductance.

5. A memory circuit as claimed in claim 2, wherein said current path between said supply voltage source and said word line is passed through a weak transistor and a strong transistor disposed in parallel.

6. A memory circuit as claimed in claim 5, wherein said word line driver circuitry controls said weak transistor and said strong transistor such that:
(i) when said bit cell is not being accessed said weak transistor is in a low conductance state and said strong transistor is in a low conductance state;
(ii) during said first change period said weak transistor is in a high conductance state and said strong transistor is in said low conductance state;
(iii) during said first delay period said weak transistor is in said low conductance state and said strong transistor is in said low conductance state;
(iv) during said second change period and said second delay period said strong transistor is in a high conductance state; and
(v) during said third change period said weak transistor is in said low conductance state and said strong transistor is in said low conductance state.

7. A memory circuit as claimed in claim 6, wherein during said second change period and said second delay period said weak transistor is in said low conductance state.

8. A memory circuit as claimed in claim 5, wherein word line driver circuitry comprises buffer circuitry configured to respond to a word line selecting signal to drive said word line to said word line voltage, said weak transistor and said strong transistor providing a power supply current to said buffer circuitry from said supply voltage source.

9. A memory circuit as claimed in claim 2, wherein said word line driver circuitry is configured select between a plurality of values of said first change period in dependence upon one or more received configuration signals.

10. A memory circuit as claimed in claim 1, wherein said word line driver circuitry is configured also to operate in a basic mode in which said word line voltage is controlled during a read access to said bit cell:
(i) to change during a first normal mode change period from said first voltage level to said high voltage level;
(ii) substantially to maintain during a normal mode delay period said high voltage level; and
(iii) to change during a second normal mode change period from said high voltage level to said first voltage level.

11. A memory circuit as claimed in claim 10, comprising a sense amplifier coupled to said at least one bit cell and configured to read said data signal from said bit line when activated by an activation signal and delay circuitry configured to supply said activation signal to said sense amplifier after a delay period during an access operation of said bit cell, wherein said delay circuitry is configured to decrease said delay period when said word line circuitry is operating in said basic mode.

12. A memory circuit as claimed in claim 1, wherein said word line driver circuitry is configured select between a plurality of values of said first delay period in dependence upon one or more received configuration signals.

13. A memory circuit comprising:
an array of bit cell means for storing data values, said array including bit cell means coupled to at least one bit line and a word line, said bit cell means having a node storing a data value and word line transistor means for providing a current path between said node and a bit line of said at least one bit line with a conductance dependent upon a word line voltage of a word line signal upon said word line; and word line driver means for controlling said word line voltage during an access to said bit cell means:
(i) to change during a first change period from a first voltage level at which said word line transistor means has a low conductance to an intermediate voltage level at which said word line transistor means has an intermediate conductance;
(ii) substantially to maintain during a first delay period said intermediate voltage level;
(iii) to change during a second change period from said intermediate level to a second voltage level at which said word line transistor means has a high conductance;
(iv) substantially to maintain during a second delay period said second voltage level; and
(v) to change during a third change period from said second voltage level to said first voltage level; wherein
said intermediate voltage level is between said first voltage level and said second voltage level.

14. A method of operating a memory circuit having:
an array of bit cells including a bit cell coupled to at least one bit line and a word line, said bit cell having a node storing a data value and a word line transistor configured to provide a current path between said node and said bit line with a conductance dependent upon a word line voltage of a word line signal upon said word line, said method comprising the steps of:
(i) changing during a first change period from a first voltage level at which said word line transistor has a low conductance to an intermediate voltage level at which said word line transistor has an intermediate conductance;
(ii) substantially maintaining during a first delay period said intermediate voltage level;
(iii) changing during a second change period from said intermediate level to a second voltage level at which said word line transistor has a high conductance;
(iv) substantially maintaining during a second delay period said second voltage level; and
(v) changing during a third change period from said second voltage level to said first voltage level; wherein
said intermediate voltage level is between said first voltage level and said second voltage level.

15. A method as claimed in claim 14, wherein a word line driver circuit provides a current path between a supply voltage source and said word line, said method comprising controlling said current path to provide:
(i) a first low conductance when said bit cell is not accessed;
(ii) an intermediate conductance during said first change period;
(iii) a second low conductance during said first delay period;
(iv) a high conductance during said second change period and said second delay period; and
(v) a third low conductance during said third change period; and
said intermediate conductance is between said first low conductance and said high conductance.

16. A method as claimed in claim 15, wherein said first low conductance and said second low conductance are a common low conductance.

17. A method as claimed in claim 16, wherein said third low conductance is said common low conductance.

18. A method as claimed in claim 15, wherein said current path between said supply voltage source and said word line is passed through a weak transistor and a strong transistor disposed in parallel.

19. A method as claimed in claim 18, comprising controlling said weak transistor and said strong transistor such that:
(i) when said bit cell is not being read said weak transistor is in a low conductance state and said strong transistor is in a low conductance state;
(ii) during said first change period said weak transistor is in a high conductance state and said strong transistor is in said low conductance state;
(iii) during said first delay period said weak transistor is in said low conductance state and said strong transistor is in said low conductance state;
(iv) during said second change period and said second delay period said strong transistor is in a high conductance state; and
(v) during said third change period said weak transistor is in said low conductance state and said strong transistor is in said low conductance state.

20. A method as claimed in claim 19, wherein during said second change period and said second delay period said weak transistor is in said low conductance state.

21. A method as claimed in claim 18, wherein said weak transistor and said strong transistor providing a power supply current to buffer circuitry from said supply voltage source, said buffer circuitry responding to a word line selecting signal to drive said word line to said word line voltage.

22. A method as claimed in claim 15, comprising selecting between a plurality of values of said first change period in dependence upon one or more received configuration signals.

23. A method as claimed in claim 14, comprising operating in a basic mode in which said word line voltage is controlled during an access to said bit cell:
(i) to change during a first normal mode change period from said first voltage level to said high voltage level;
(ii) substantially to maintain during a normal mode delay period said high voltage level; and
(iii) to change during a second normal mode change period from said high voltage level to said first voltage level.

24. A method as claimed in claim 23, comprising the steps of supplying an activation signal to a sense amplifier after a delay period during an access operation of said bit cell and decreasing said delay period when said word line circuitry is operating in said basic mode.

25. A method as claimed in claim 14, comprising selecting between a plurality of values of said first delay period in dependence upon one or more received configuration signals.

* * * * *